United States Patent
Zhang et al.

(10) Patent No.: US 10,209,616 B2
(45) Date of Patent: Feb. 19, 2019

(54) MASK PLATE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Chaobo Zhang, Beijing (CN); Liangliang Liu, Beijing (CN); Hongwei Tian, Beijing (CN); Nini Bai, Beijing (CN); Shuai Han, Beijing (CN); Feng Kang, Beijing (CN); Liang Tang, Beijing (CN); Chuoluopeng, Beijing (CN); Tiangui Min, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 1 day.

(21) Appl. No.: 15/193,992

(22) Filed: Jun. 27, 2016

(65) Prior Publication Data
US 2017/0227842 A1 Aug. 10, 2017

(30) Foreign Application Priority Data

Feb. 4, 2016 (CN) .......................... 2016 1 0080491

(51) Int. Cl.
G03F 1/38 (2012.01)
G03F 1/52 (2012.01)
G03F 7/20 (2006.01)

(52) U.S. Cl.
CPC ................. *G03F 1/52* (2013.01); *G03F 1/38* (2013.01); *G03F 7/70283* (2013.01); *G03F 7/70308* (2013.01); *G03F 7/70325* (2013.01)

(58) Field of Classification Search
None
See application file for complete search history.

(56) References Cited

U.S. PATENT DOCUMENTS

2007/0128528 A1* 6/2007 Hess ...................... B82Y 10/00
430/5
2010/0062350 A1* 3/2010 Abe ...................... C03B 23/0252
430/5

OTHER PUBLICATIONS

I.H. Malitson, "Interspecimen Comparison of the Refractive Index of Fused Silica", Oct. 1965, Journal of the Optical Society of America, vol. 55, No. 10, pp. 1205-1209.*

* cited by examiner

*Primary Examiner* — Steven Whitesell Gordon
(74) *Attorney, Agent, or Firm* — Nath, Goldberg & Meyer; Joshua B. Goldberg; Daniel Bissing

(57) ABSTRACT

The present invention provides a mask plate, relating to a field of exposure technology, which can solve the problem of an existing mask plate that a resolution is limited by an effect of diffraction. The mask plate of the invention includes: a pattern structure, including a light blocking region and a light transmitting region; and a total reflection structure provided at an light-exiting side of the pattern structure, the total reflection structure including a high refraction layer and a first low refraction layer sequentially provided in a direction away from the pattern structure and contacting each other, wherein a refractive index of the high refraction layer is greater than a refractive index of the first low refraction layer.

10 Claims, 2 Drawing Sheets

MASK PLATE

FIELD OF THE INVENTION

The present invention relates to the field of exposure technology, and in particular relates to a mask plate.

BACKGROUND OF THE INVENTION

Many structures in display substrates, integrated circuits and the like are all prepared by a photo-lithography process, and exposure is an important step in the photo-lithography process, which is performed mainly by a mask plate.

As shown in FIG. 1, a mask plate includes a light blocking region 12 and a light transmitting region 11, wherein the light blocking region 12 can block light and the light transmitting region 11 allows light to transmit therethrough. Therefore, exposure light (for example ultraviolet light) radiated to the mask plate vertically can only transmit through the light transmitting region 11 so as to expose a region corresponding to the light transmitting region 11, to form a corresponding exposure pattern on the region.

As the technology develops, some structures in display substrates, integrated circuits and the like are becoming finer, and the corresponding size of the light transmitting region 11 is becoming smaller as well. Thus, as shown in FIG. 1, light passing through the light transmitting region 11 is equivalent to it passing through a fine slit, there inevitably occurs a significant diffraction and thus an oblique radiation is generated, further resulting in a larger width of a region actually illuminated by the light than a width of the light transmitting region 11, which affects a precision of the exposure and a resolution.

SUMMARY OF THE INVENTION

In view of the problem in which the resolution of an existing mask plate is limited due to the diffraction, a mask plate that can realize a higher precision of exposure and a higher resolution is provided.

As a solution to solve the technical problem of the present invention, there is provided a mask plate, comprising:

a pattern structure, including a light blocking region and a light transmitting region; and a total reflection structure provided at an light-exiting side of the pattern structure, the total reflection structure including a high refraction layer and a first low refraction layer sequentially provided in a direction away from the pattern structure and contacting each other, wherein a refractive index of the high refraction layer is greater than a refractive index of the first low refraction layer.

Optionally, the refractive index of the high refraction layer ranges from 1.52 to 1.76; and the refractive index of the first low refraction layer ranges from 1.2 to 1.5.

Optionally, the high refraction layer is formed of any one material of aluminum oxide, lanthanum trifluoride, and neodymium trifluoride; and the first low refraction layer is formed of any one material of silicon dioxide, magnesium fluoride, and aluminum fluoride.

Optionally, the mask plate further comprises: a second low refraction layer, provided between the high refraction layer and the pattern structure and contacting the high refraction layer, wherein the refractive index of the high refraction layer is greater than a refractive index of the second low refraction layer.

Optionally, the refractive index of the second low refraction layer ranges from 1.2 to 1.5.

Optionally, the second low refraction layer is formed of any one material of silicon dioxide, magnesium fluoride, and aluminum fluoride.

Optionally, a thickness of the high refraction layer is an even multiple of one fourth of a main exposure wavelength in the high refraction layer; a thickness of the first low refraction layer is an odd multiple of one fourth of a main exposure wavelength in the first low refraction layer; and a thickness of the second low refraction layer is an odd multiple of one fourth of a main exposure wavelength in the second low refraction layer.

Optionally, the second low refraction layer serves as a supporting layer that supports the pattern structure, the high refraction layer and the first low refraction layer.

Optionally, the supporting layer is formed of silica glass.

Optionally, a thickness of the supporting layer ranges from 7 mm to 15 mm.

The mask plate of the present invention includes a high refraction layer and a first low refraction layer, and a refractive index of the high refraction layer is greater than a refractive index of the first low refraction layer, thus when a light transmitting from a light transmitting region and undergoing diffraction is incident on an interface between the high refraction layer and the first low refraction layer, total reflection may occur if the incident angle is too big, and the light cannot be radiated from the first low refraction layer; therefore, the mask plate of the present invention only allows light in a direction vertical or approximately vertical to the mask plate to transmit, so as to reduce the influence of diffraction on a size of the exposure pattern, and to increase a precision of the exposure and a resolution.

DETAILED DESCRIPTION OF THE EMBODIMENTS

In order to provide a better understanding of the technical solutions of the present invention to those skilled in the art, the invention is described in further detail below in conjunction with the drawings and specific implementations.

Figure 1:
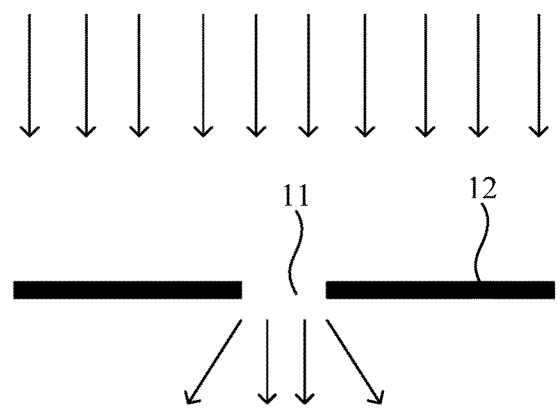
FIG. 1 is a schematic view of a structure of an existing mask plate.
Figure 2:
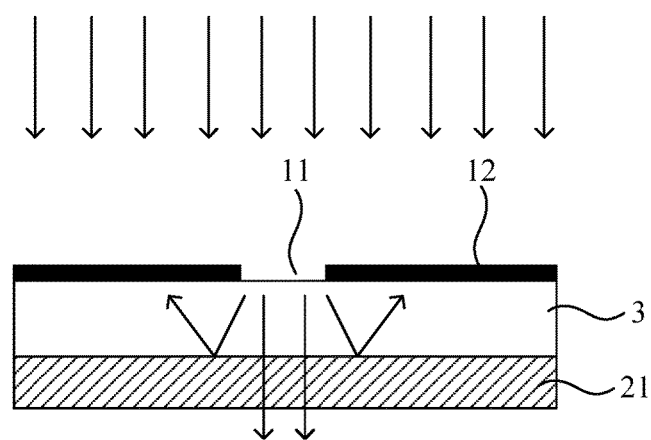
FIG. 2 is a schematic view of a structure of a mask plate of an embodiment of the invention.
Figure 3:
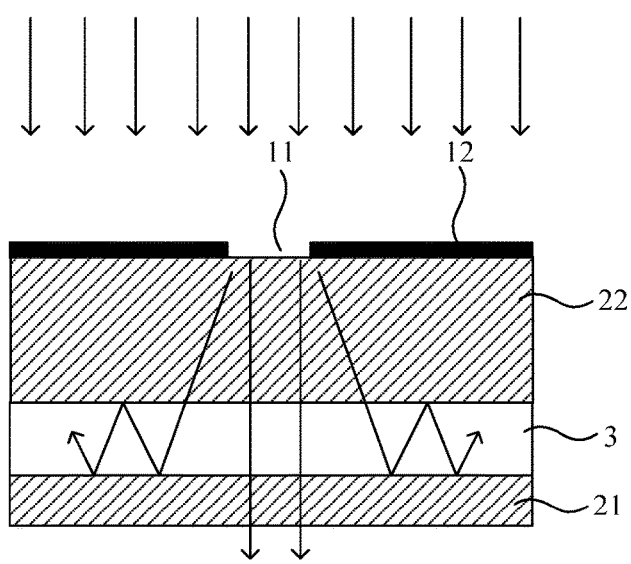
FIG. 3 is a schematic view of a structure of another mask plate of an embodiment of the invention.

As shown in FIG. 2 and FIG. 3, the present embodiment provides a mask plate, including:

a pattern structure, including a light blocking region 12 and a light transmitting region 11; and a total reflection structure provided at a light-exiting side of the pattern structure, the total reflection structure including a high refraction layer 3 and a first low refraction layer 21 sequentially provided in a direction away from the pattern structure and contacting each other, wherein a refractive index of the high refraction layer 3 is greater than a refractive index of the first low refraction layer 21.

The pattern structure in the mask plate of the present embodiment includes a regular light blocking region 12 and a regular light transmitting region 11, wherein the light blocking region 12 can block light, while the light transmitting region 11 allows light to pass through, and a pattern formed by the light transmitting region 11 corresponds to an exposure pattern. The light blocking region 12 is formed of a light blocking material layer, such as a black light blocking layer, a reflective metal layer and the like. The light transmitting region 11 may be an opening provided on the light blocking material layer, or may be a transparent layer, which is not described in detail herein.

Unlike the regular mask plate, as shown in FIG. 2, the mask plate of the present embodiment further has a total reflection structure provided at the light-exiting side of the above pattern structure. The total reflection structure includes the high refraction layer 3, and the first low refraction layer 21 located at a side of the high refraction layer 3 away from the pattern structure, and a refractive index of the high refraction layer 3 is greater than a refractive index of the first low refraction layer 21.

As well-known in the art, when light is incident into an optically thinner medium (a medium with a lower refractive index) from an optically denser medium (a medium with a higher refractive index), the refraction angle is greater than the incident angle; when the incident angle is increased up to a critical angle, the refraction angle reaches 90 degrees; at this time, the light cannot transmit into the optically thinner medium from the optically denser medium, but may reflect back to the optically denser medium, that is, a "total reflection" occurs. The critical angle (represented by C) should satisfy an equation of $\sin C = n2/n1$, where n1 is the refractive index of the optically denser medium, and n2 is the refractive index of the optically thinner medium. The refractive index of the high refraction layer 3 is greater than the refractive index of the first low refraction layer 21 in the mask plate of the present embodiment, thus, as shown in FIG. 2, for light that is transmitted from the light transmitting region 11 and undergoing diffraction, if the diffraction angle thereof is too big, then the refraction angle thereof is also big when the light is incident on the interface between the high refraction layer 3 and the first low refraction layer 21. Once the diffraction angle exceeds the critical angle, a total reflection will occur and the light cannot be radiated from the first low refraction layer 21. This ensures that only light incident along a direction vertical or approximately vertical to the mask plate can be finally transmitted through the mask plate, such that an influence of the diffraction on a size of the exposure pattern is reduced, and a higher precision of the exposure and a higher resolution are easily realized.

Preferably, the above mask plate further includes a second low refraction layer 22, provided between the high refraction layer 3 and the pattern structure and contacting the high refraction layer 3, wherein the refractive index of the high refraction layer 3 is greater than a refractive index of the second low refraction layer 22.

As shown in FIG. 3, the second low refraction layer 22 is provided on a side of the high refraction layer 3 close to the pattern structure, such that the total reflection structure becomes a three-layered structure of "low refraction—high refraction—low refraction". The advantage of adding the second low refraction layer 22 is that, after light goes through a total reflection at the interface between the high refraction layer 3 and the first low refraction layer 21 and goes back to the high refraction layer 3, it will go through another total reflection at the interface between the high refraction layer 3 and the second low refraction layer 22, thus, such a total reflection structure may prevent the light from being radiated towards an light-incoming side, realizing a more complete total reflection.

Preferably, a refractive index of the high refraction layer 3 ranges from 1.52 to 1.76; a refractive index of the first low refraction layer 21 ranges from 1.2 to 1.5; and a refractive index of the second low refraction layer 22 ranges from 1.2 to 1.5. More preferably, the high refraction layer 3 is formed of any one material of aluminum oxide, lanthanum trifluoride, and neodymium trifluoride; the first low refraction layer 21 is formed of any one material of silicon dioxide, magnesium fluoride, and aluminum fluoride; and the second low refraction layer 22 is formed of any one material of silicon dioxide, magnesium fluoride, and aluminum fluoride.

The refractive indices of the high refraction layer 3 and the two low refraction layers 21 and 22 are preferably determined in consideration of ensuring a precision of the exposure and of actual refractive indices of existing common materials. Apparently, other ranges of refractive indices may also be employed, as long as the refractive index of the high refraction layer 3 is greater than the refractive indices of the first low refraction layer 21 and the second low refraction layer 22. Accordingly, the high refraction layer 3 may specifically employ materials such as aluminum oxide ($Al_2O_3$) or fluoride having a relatively high refractive index for light in ultraviolet regions, and the like; the two low refraction layers 21 and 22 may employ materials such as silicon dioxide ($SiO_2$) or fluoride having a relatively low refractive index for light in ultraviolet regions, and the like.

Preferably, the second low refraction layer 22 may also serve as a supporting layer for supporting the pattern structure, the high refraction layer 3 and the first low refraction layer 21. More preferably, the supporting layer is formed of silica glass, with a thickness between 7 mm and 15 mm.

Apparently, the mask plate in its entirety must have sufficient thickness and hardness, to ensure that it can be applied in practice. Thus, it is required to have at least one supporting layer in the mask plate, which has a large thickness and a high hardness, and can perform a function of supporting other structures. Specifically, considering aspects of easiness of preparation, ensuring a stability of the pattern structure and the like, the second low refraction layer 22 is preferably employed as a supporting layer. Then, other structures such as the pattern structure, the high refraction layer 3, and the first low refraction layer 21 may respectively formed on both sides of the second low refraction layer 22, for example, the pattern structure may be formed on one side of the second low refraction layer 22, the high refraction layer 3 and the first low refraction layer 21 may be sequentially formed on the other side of the second low refraction layer 22. The material of the second low refraction layer 22 as the supporting layer is required to have a sufficiently high hardness, for example, silica glass (a form of silicon dioxide) with a relatively high hardness or the like may be employed. And the second low refraction layer 22 is required to have a sufficiently large thickness, for example, in a range of 7 mm to 15 mm or in another appropriate range. Apparently, any layer, other than the second low refraction layer 22, may also be selected to be the supporting layer, for example, the first low refraction layer 21 or the high refraction layer 3, or an additional supporting layer may be added as well.

Preferably, a thickness of the high refraction layer 3 is an even multiple of one fourth of a main exposure wavelength in the high refraction layer 3; a thickness of the first low refraction layer 21 is an odd multiple of one fourth of a main exposure wavelength in the first low refraction layer 21; and a thickness of the second low refraction layer 22 is an odd multiple of one fourth of a main exposure wavelength in the second low refraction layer 22.

When performing the exposure, light of a particular wavelength is generally employed, and the wavelength of this light is referred to as the main exposure wavelength. Since a wavelength of light in a medium is associated to the refractive index of the medium, the main exposure wavelengths in materials with different refractive indices are different. Preferably, a thickness of each of the layers in the above total reflection structure is a particular multiple (e.g. even multiple or odd multiple) of one fourth of the main exposure wavelength in that layer. In this case, the total reflection structure constitutes a high transmission film, thus loss of light transmitted along a direction vertical or approximately vertical to the mask plate can be reduced, thereby decreasing energy consumption.

Taking a main exposure wavelength of 436 nm in air as an example, if the second low refraction layer 22 is a supporting layer formed of silica glass, then its thickness is an odd multiple of one fourth of the corresponding main exposure wavelength, and may be selected to be 7.47 mm; if the high refraction layer 3 is formed of aluminum oxide, then its thickness is an even multiple of one fourth of the corresponding main exposure wavelength, and may be selected to be 269 nm; and if the first low refraction layer 21 is formed of silicon dioxide, then its thickness is an odd multiple of one fourth of the corresponding main exposure wavelength, and may be selected to be 373 nm. Of course, the above description is only a specific example of the total reflection structure, and is not directed to limit the protection scope of the present invention.

It can be understood that the foregoing implementations are merely exemplary implementations used for describing the principle of the present invention, but the present invention is not limited thereto. Those of ordinary skill in the art may make various variations and modifications without departing from the spirit and essence of the present invention, and these variations and modifications shall fall into the protection scope of the present invention.

The invention claimed is:

1. A mask plate, comprising:
   a pattern structure, including a light blocking region and a light transmitting region; and
   a total reflection structure provided at a light-exiting side of the pattern structure, the total reflection structure including a high refraction layer and a first low refraction layer sequentially provided in a direction away from the pattern structure and contacting each other, wherein a refractive index of the high refraction layer is greater than a refractive index of the first low refraction layer,
   wherein the total reflection structure is configured to totally reflect light that has a diffraction angle greater than a predetermined angle, such that light transmitted through the mask plate has a direction substantially vertical to the mask plate, and
   wherein in a case that the light transmitted through the mask plate has a main exposure wavelength of 436 nm in air, a thickness of the high refraction layer is an even multiple of one fourth of a main exposure wavelength, in the high refraction layer, of the light transmitted through the mask plate; and a thickness of the first low refraction layer is an odd multiple of one fourth of a main exposure wavelength, in the first low refraction layer, of the light transmitted through the mask plate.

2. The mask plate according to claim 1, wherein
   the high refraction layer is formed of any one material of aluminum oxide, lanthanum trifluoride, and neodymium trifluoride; and
   the first low refraction layer is formed of any one material of silicon dioxide, magnesium fluoride, and aluminum fluoride.

3. The mask plate according to claim 1, further comprising:
   a second low refraction layer, provided between the high refraction layer and the pattern structure and contacting the high refraction layer, wherein the refractive index of the high refraction layer is greater than a refractive index of the second low refraction layer.

4. The mask plate according to claim 3, wherein
   the refractive index of the high refraction layer ranges from 1.52 to 1.76;
   the refractive index of the first low refraction layer ranges from 1.2 to 1.5; and
   the refractive index of the second low refraction layer ranges from 1.2 to 1.5.

5. The mask plate according to claim 4, wherein
   the high refraction layer is formed of any one material of aluminum oxide, lanthanum trifluoride, and neodymium trifluoride;
   the first low refraction layer is formed of any one material of silicon dioxide, magnesium fluoride, and aluminum fluoride; and
   the second low refraction layer is formed of any one material of silicon dioxide, magnesium fluoride, and aluminum fluoride.

6. The mask plate according to claim 3, wherein
   a thickness of the second low refraction layer is an odd multiple of one fourth of a main exposure wavelength, in the second low refraction layer, of the light transmitted through the mask plate.

7. The mask plate according to claim 3, wherein
   the second low refraction layer serves as a supporting layer that supports the pattern structure, the high refraction layer and the first low refraction layer.

8. The mask plate according to claim 7, wherein
   the supporting layer is formed of silica glass.

9. The mask plate according to claim 7, wherein
   a thickness of the supporting layer ranges from 7 mm to 15 mm.

10. The mask plate according to claim 1, wherein
    the refractive index of the high refraction layer ranges from 1.52 to 1.76; and
    the refractive index of the first low refraction layer ranges from 1.2 to 1.5.

* * * * *